United States Patent
Chung et al.

(10) Patent No.: US 11,427,926 B2
(45) Date of Patent: *Aug. 30, 2022

(54) SILICON-BASED MOLTEN COMPOSITION AND METHOD FOR MANUFACTURING SILICON CARBIDE SINGLE CRYSTAL USING THE SAME

(71) Applicant: LG Chem, Ltd., Seoul (KR)

(72) Inventors: Chan Yeup Chung, Daejeon (KR); Ho Rim Lee, Daejeon (KR); Kyoung Hoon Kim, Daejeon (KR); Jung Min Ko, Daejeon (KR)

(73) Assignee: LG Chem, Ltd.

( * ) Notice: Subject to any disclaimer, the term of this patent is extended or adjusted under 35 U.S.C. 154(b) by 173 days.

This patent is subject to a terminal disclaimer.

(21) Appl. No.: 16/086,921

(22) PCT Filed: Aug. 22, 2017

(86) PCT No.: PCT/KR2017/009157
§ 371 (c)(1),
(2) Date: Sep. 20, 2018

(87) PCT Pub. No.: WO2018/062689
PCT Pub. Date: Apr. 5, 2018

(65) Prior Publication Data
US 2019/0106806 A1    Apr. 11, 2019

(30) Foreign Application Priority Data
Sep. 29, 2016 (KR) .................... 10-2016-0125889

(51) Int. Cl.
*C30B 19/04* (2006.01)
*C30B 9/06* (2006.01)
(Continued)

(52) U.S. Cl.
CPC ............ *C30B 19/04* (2013.01); *C01B 32/956* (2017.08); *C30B 9/06* (2013.01); *C30B 9/10* (2013.01); *C30B 29/36* (2013.01); *H01L 21/02* (2013.01)

(58) Field of Classification Search
CPC ....... C01B 32/956; C30B 19/04; C30B 29/36; C30B 9/06; C30B 9/10; H01L 21/02
See application file for complete search history.

(56) References Cited

U.S. PATENT DOCUMENTS

2004/0016929 A1   1/2004  Nakatsuka et al.
2005/0183657 A1   8/2005  Kusunoki et al.
(Continued)

FOREIGN PATENT DOCUMENTS

CN          1863945 A      11/2006
CN        104695019 A       6/2015
(Continued)

OTHER PUBLICATIONS

International Search Report for Application No. PCT/KR2017/009157 dated Nov. 24, 2017.
(Continued)

Primary Examiner — Hua Qi
(74) Attorney, Agent, or Firm — Lerner, David, Littenberg, Krumholz & Mentlik, LLP (57) ABSTRACT

A silicon-based molten composition according to an exemplary embodiment is used for a solution growth method for forming a silicon carbide single crystal, and represented by Formula 1 including silicon (Si), a first metal M1, a second metal M2 and a third metal M3, wherein the first metal M1 is one or more selected from the group consisting of nickel (Ni) and manganese (Mn), the second metal M2 is one or more selected from the group consisting of scandium (Sc) and titanium (Ti), and the third metal M3 is one or more selected from the group consisting of aluminum (Al) and gallium (Ga):

(Continued)

$$Si_aM1_bM2_cM3_d \qquad \text{Formula 1}$$

wherein a is 0.3 to 0.8, b is 0.1 to 0.5, c is 0.01 to 0.3, d is 0.01 to 0.2, and a+b+c+d is 1.

7 Claims, 8 Drawing Sheets

(51) Int. Cl.
*C30B 9/10* (2006.01)
*C30B 29/36* (2006.01)
*H01L 21/02* (2006.01)
*C01B 32/956* (2017.01)

(56) References Cited

U.S. PATENT DOCUMENTS

| | | |
|---|---|---|
| 2006/0292057 A1 | 12/2006 | Nakamura |
| 2011/0177311 A1* | 7/2011 | Manabe ............ C08K 5/20 428/213 |
| 2012/0237428 A1 | 9/2012 | Ryo et al. |
| 2015/0159297 A1 | 6/2015 | Shinya et al. |
| 2015/0159299 A1* | 6/2015 | Shinya ............ C30B 11/08 117/35 |
| 2015/0167197 A1 | 6/2015 | Ujihara et al. |
| 2016/0208411 A1 | 7/2016 | Shirai |
| 2016/0230309 A1* | 8/2016 | Danno ............ C30B 29/36 |
| 2016/0273126 A1 | 9/2016 | Kusunoki et al. |

FOREIGN PATENT DOCUMENTS

| | | | |
|---|---|---|---|
| JP | 2003077860 A | | 3/2003 |
| JP | 2006069861 A | | 3/2006 |
| JP | 2007076986 A | | 3/2007 |
| JP | 2008100890 A | | 5/2008 |
| JP | 2008100890 A | * | 5/2008 |
| JP | 4151528 B2 | | 9/2008 |
| JP | 5167947 B2 | | 3/2013 |
| JP | 5218348 B2 | | 6/2013 |
| KR | 20120057536 A | | 6/2012 |
| KR | 20120091054 A | | 8/2012 |
| KR | 20150066459 A | | 6/2015 |
| KR | 20160034397 A | | 3/2016 |
| KR | 20160078343 A | | 7/2016 |

OTHER PUBLICATIONS

Chinese Search Report for Application No. 201780017884.3 dated May 19, 2020, 1 page.

* cited by examiner

SILICON-BASED MOLTEN COMPOSITION AND METHOD FOR MANUFACTURING SILICON CARBIDE SINGLE CRYSTAL USING THE SAME

CROSS-REFERENCE TO RELATED APPLICATIONS

This application is a national phase entry under 35 U.S.C. § 371 of International Application No. PCT/KR2017/009157, filed Aug. 22, 2017, which claims priority to Korean Patent Application No. 10-2016-0125889, filed Sep. 29, 2016, the disclosures of which are incoporated herein by reference.

TECHNICAL FIELD

The present invention relates to a silicon-based molten composition, and a method for manufacturing a silicon carbide single crystal using the same.

BACKGROUND ART

An electric power semiconductor device is a core device in the next generation systems using electric energy such as electric vehicles, power systems and high frequency mobile communications. For this, it is necessary to select materials appropriate for high voltage, high current, high frequency and the like. Though a silicon single crystal has been used as an electric power semiconductor material, due to its limitation of physical properties, a silicon carbide single crystal which has a low energy loss, and is drivable in more extreme environments is attracting attention.

For growing the silicon carbide single crystal, as an example, a sublimation method sublimating silicon carbide as a raw material at a high temperature of 2000 degrees (° C.) or more to grow a single crystal, a solution growth method of application of a crystal pulling method, a chemical vapor deposition method using a gas source, and the like are used.

However, in the case of using the chemical vapor deposition method, only growth into a thin film level having a limited thickness is possible, and in the case of using the sublimation method, defects such as micropipe and stacking defects are likely to occur, and thus, there is a limitation in terms of production costs. Thus, a study on the solution growth method which is known to have a lower crystal growth temperature than the sublimation method, and to be advantageous for a larger diameter and higher quality has been conducted.

DISCLOSURE

Technical Problem

The present invention has been made in an effort to provide a silicon-based molten composition having advantages of precipitating a silicon carbide single crystal at a low process temperature, and a method for manufacturing the silicon carbide single crystal using the same.

In addition, the technical object to be solved by the present invention is not limited to those mentioned above, and another technical objects which are not mentioned will be clearly understood by a person with ordinary skill in the art to which the present invention pertains from the following description.

Technical Solution

An exemplary embodiment of the present invention provides a silicon-based molten composition used for a solution growth method for forming a silicon carbide single crystal, and represented by the following Formula 1, including silicon (Si), a first metal M1, a second metal M2 and a third metal M3, wherein the first metal M1 is one or more selected from the group consisting of nickel (Ni) and manganese (Mn), the second metal M2 is one or more selected from the group consisting of scandium (Sc) and titanium (Ti), and the third metal M3 is one or more selected from the group consisting of aluminum (Al) and gallium (Ga):

$$Si_a M1_b M2_c M3_d \quad \text{Formula 1}$$

wherein a is 0.3 to 0.8, b is 0.1 to 0.5, c is 0.01 to 0.3, d is 0.01 to 0.2, and a+b+c+d is 1.

In Formula 1, a may be 0.4 to 0.7, b may be 0.2 to 0.4, c may be 0.05 to 0.2, and d may be 0.01 to 0.1.

The content of the first metal M1 may be higher than the content of the second metal M2, and the content of the second metal M2 may be higher than the content of the third metal M3.

The first metal M1 may have a melting point of 1600 degrees (° C.) or less, preferably 1500 degrees (° C.) or less.

The second metal M2 may have a melting point of 1800 degrees (° C.) or less, preferably 1700 degrees (° C.) or less.

The third metal M3 may have a melting point of 800 degrees (° C.) or less, preferably 700 degrees (° C.) or less.

The first metal M1 may be nickel (Ni), the second metal M2 may be titanium (Ti), and the third metal M3 may be aluminum (Al).

Another embodiment of the present invention provides a method for manufacturing a silicon carbide single crystal including: preparing a silicon carbide seed crystal; preparing a silicon-based molten composition including silicon (Si), a first metal M1, a second metal M2 and a third metal M3; dissolving carbon (C) in the silicon-based molten composition to form a molten solution; and supercooling the molten solution to grow a silicon carbide single crystal on the seed crystal, wherein the silicon-based molten composition is represented by the following Formula 1, and the first metal M1 is one or more selected from the group consisting of nickel (Ni) and manganese (Mn), the second metal M2 is one or more selected from the group consisting of scandium (Sc) and titanium (Ti), and the third metal M3 is one or more selected from the group consisting of aluminum (Al) and gallium (Ga):

$$Si_a M1_b M2_c M3_d \quad \text{Formula 1}$$

wherein a is 0.3 to 0.8, b is 0.1 to 0.5, c is 0.01 to 0.3, d is 0.01 to 0.2, and a+b+c+d is 1.

Advantageous Effects

According to an exemplary embodiment as described above, a silicon-based molten composition capable of precipitating a silicon carbide single crystal at low process temperature, and a method for manufacturing a silicon carbide single crystal using the same may be provided.

MODE FOR INVENTION

Hereinafter, the exemplary embodiments of the present invention will be described in detail, referring to the accompanying drawings. However, in the description of the present disclosure, descriptions for already known functions or components will be omitted for clarifying the gist of the present disclosure.

In order to clearly describe the present disclosure, parts which are not related to the description are omitted, and the same reference numeral refers to the same or like components, throughout the specification. In addition, since the size and the thickness of each component shown in the drawing are optionally represented for convenience of the description, the present disclosure is not limited to the illustration.

Hereinafter, the silicon-based molten composition according to an exemplary embodiment will be described.

The silicon-based molten composition according to an exemplary embodiment may include silicon (Si), a first metal M1, a second metal M2 and a third metal M3. The silicon-based molten composition may be represented by the following Formula 1:

$$Si_a M1_b M2_c M3_d \qquad \text{Formula 1}$$

wherein a is 0.3 to 0.8, b is 0.1 to 0.5, c is 0.01 to 0.3, and d is 0.01 to 0.2. Preferably, a may be 0.4 to 0.7, b may be 0.2 to 0.4, c may be 0.05 to 0.2, and d may be 0.01 to 0.1. a+b+c+d is 1.

Silicon (Si) may be included in the silicon-based molten composition, at 30 at % to 80 at %, preferably 40 at % to 70 at %. The first metal M1 may be included in the silicon-based molten composition at 10 at % to 50 at %, preferably 20 at % to 40 at %. The second metal M2 may be included in the silicon-based molten composition at 1 at % to 30 at %, preferably at 5 at % to 20 at %. The third metal M3 may be included in the silicon-based molten composition at 1 at % to 20 at %, preferably 1 at % to 10 at %.

Here, the content of the metal included the silicon-based molten composition according to an exemplary embodiment is in the order of the first metal M1, the second metal M2 and the third metal M3. When silicon is included more than the content, the growth rate of the silicon carbide single crystal may be lowered, and when the metal is included more than the content, a polycrystalline silicon carbide may be precipitated to deteriorate the quality of the single crystal.

The first metal M1 may be one or more selected from the group consisting of nickel (Ni) and manganese (Mn), and the second metal M2 may be one or more selected from the group consisting of scandium (Sc) and titanium (Ti), and the third metal M3 may be one or more selected from the group consisting of aluminum (Al) and gallium (Ga). The silicon-based molten composition according to an exemplary embodiment may include at least one of each of the first metal M1, the second metal M2 and the third metal M3.

The first metal M1 may assist uniform mixing of the raw materials included in the molten solution, in the silicon-based molten solution. The second metal M2 may improve carbon solubility in the silicon-based molten solution. In addition, the third metal M3 lowers surface energy to assist the flat growth of silicon carbide, but not limited to this function.

The first metal M1 according to an exemplary embodiment may have a melting point of 1600 degrees (° C.) or less, preferably 1500 degrees (° C.) or less. The second metal M2 may have a melting point of 1800 degrees (° C.) or less, preferably 1700 degrees (° C.) or less. The third metal M3 may have a melting point of 800 degrees (° C.) or less, preferably 700 degrees (° C.) or less. Specifically, the melting point of nickel (Ni) corresponding to the first metal M1 is 1455 degrees (° C.), the melting point of titanium (Ti) corresponding to the second metal M2 is 1668 degrees (° C.), the melting point of aluminum (Al) corresponding to the third metal M3 is 660 degrees (° C.), and the melting point of silicon (Si) is 1404 degrees (° C.).

The silicon-based molten composition according to an exemplary embodiment may have a relatively low melting point (as an example, the melting point of chromium (Cr) is 1907 degrees (° C.)), and accordingly, the precipitation process of the silicon carbide single crystal may proceed at a low process temperature. When the silicon carbide single crystal is precipitated at a low process temperature, the process may be stably controlled, and the quality of the silicon carbide single crystal to be precipitated may be improved. In addition, process time and costs may be reduced by a high crystal growth rate.

Figure 1:
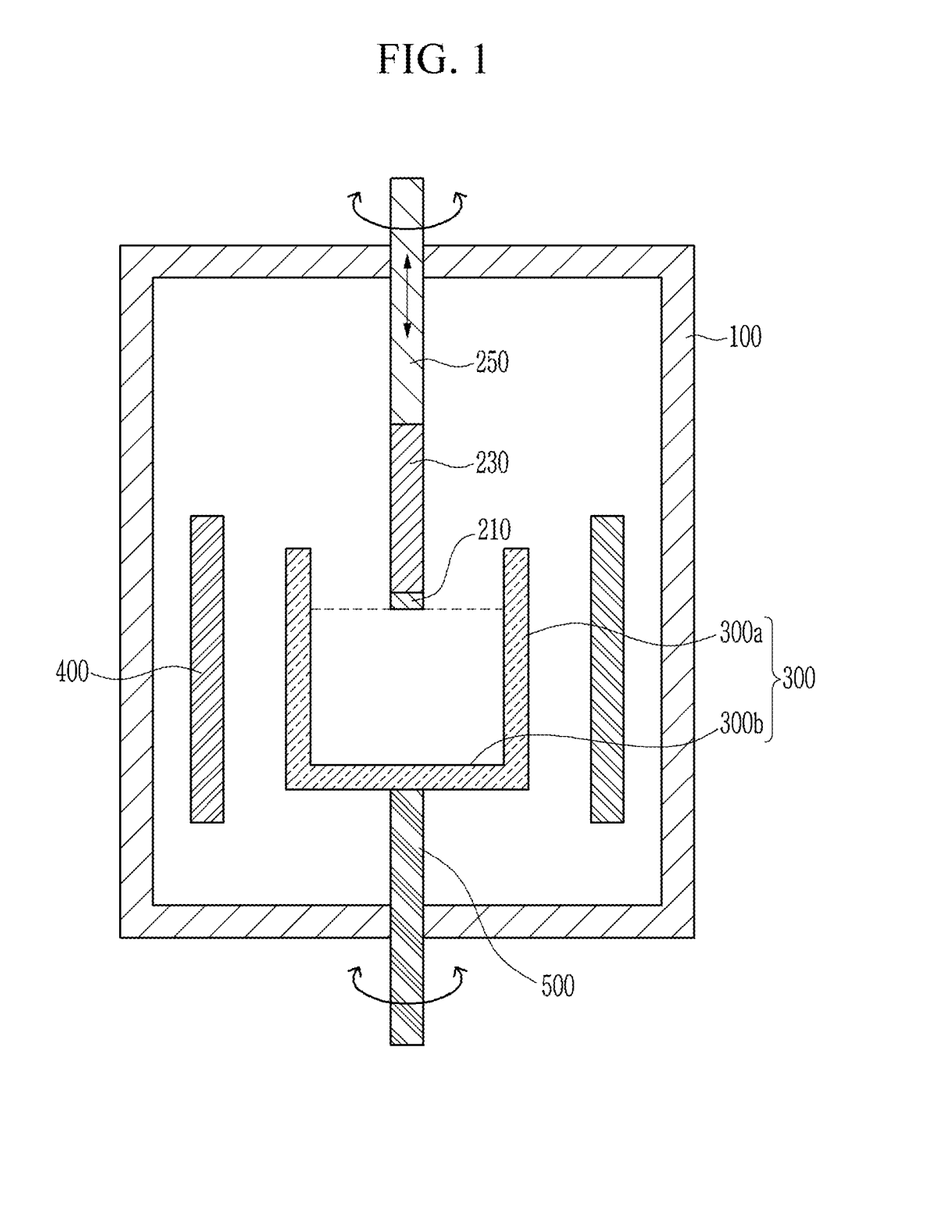
FIG. 1 is a schematic cross-sectional view of a manufacturing apparatus of a silicon carbide single crystal according to an exemplary embodiment.

FIG. 1 is a drawing for describing the configuration of the manufacturing apparatus to be used when growing a silicon carbide single crystal using the silicon-based molten composition according to an exemplary embodiment. FIG. 1 is a schematic cross-sectional view of a manufacturing apparatus of the silicon carbide single crystal according to an exemplary embodiment.

Referring to FIG. 1, the manufacturing apparatus of the silicon carbide single crystal according to an exemplary embodiment may include a reaction chamber 100, a crucible 300 disposed inside the reaction chamber 100, a seed crystal 210 extended to the inside of the crucible 300, a seed crystal support 230 connected to the seed crystal 210, and a heating member 400 for heating a moving member 250 and the crucible 300.

The reaction chamber 100 is in a closely sealed form including an empty interior space, and the inside may be maintained under an atmosphere such as constant pressure. Though it is not shown, a vacuum pump and a gas tank for controlling an atmosphere may be connected to the reaction chamber 100. After making the inside of the reaction chamber 100 vacuum using the vacuum pump and the gas tank for controlling an atmosphere, inert gas such as argon gas may be charged.

The silicon carbide seed crystal 210 may be connected to the seed crystal support 230 and the moving member 250 to be disposed inside the crucible 300, and in particular, may be disposed so that it comes into contact with a molten solution provided inside the crucible 300.

According to an exemplary embodiment, a meniscus may be formed between a surface of the silicon carbide seed crystal 210 and the molten solution. A meniscus refers to a curved surface formed on a molten solution by surface tension generated when a lower surface of the silicon carbide seed crystal 210 is slightly lifted after brought into contact with the molten solution. When growing the silicon carbide single crystal by forming the meniscus, occurrence of a polycrystal is suppressed, thereby capable of obtaining a higher-quality single crystal.

The silicon carbide seed crystal 210 is composed of a silicon carbide single crystal. The crystal structure of the silicon carbide seed crystal 210 is identical to the crystal structure of the silicon carbide single crystal intended to be manufactured. For example, when a 4H polymorphic silicon carbide single crystal is manufactured, a 4H polymorphic silicon carbide seed crystal 210 may be used. When the 4H polymorphic silicon carbide seed crystal 210 is used, a crystal growth surface is a (0001) plane or a (000-1) plane, or a surface inclined at an angle of 8° or less from a (0001) plane or a (000-1) plane.

The seed crystal support 230 connects the silicon carbide seed crystal 210 and the moving member 250. One end of the seed crystal support 230 may be connected to the moving member 250, and the other end thereof may be connected to the seed crystal 210.

The seed crystal support 230 may be connected to the moving member 250, and moved up and down along a height direction of the crucible 300. Specifically, the seed crystal support 230 is moved to the inside of the crucible 300 for a growth process of the silicon carbide single crystal, or moved to the outside of the crucible 300 after completing the growth process of the silicon carbide single crystal. In addition, in the present specification, the example in which the seed crystal support 230 is moved up and down is described, however, the present invention is not limited thereto, and the seed crystal support may be moved or rotate in any direction, and may include a known means for this.

The seed crystal support 230 may be attached to and detached from the moving member 250. In order to obtain the silicon carbide single crystal, the seed crystal support 230 may be bound to the moving member 250 to be provided inside the crucible 300, and after completing the growth process of the single crystal, may be separated from the moving member 250.

The moving member 250 is connected to a driving part (not shown) to move or rotate inside the chamber 100. The moving member 250 may include a known means for moving up and down or rotating.

The crucible 300 is provided inside the reaction chamber 100, and may be in the form of a container having an open upper side, and may include an outer circumferential surface 300a and a lower surface 300b, excluding an upper surface. The crucible 300 may have any shape for forming the silicon carbide single crystal, without limitation to the above-described shape. The crucible 300 may be charged with and accommodate molten raw materials such as silicon or silicon carbide powder.

The crucible 300 may be formed of a carbon-containing material such as graphite and silicon carbide, and the crucible 300 formed of this material itself may be used as a source of a carbon raw material. Otherwise, the crucible is not limited thereto, and a crucible formed of a ceramic material may be used as the crucible, and the material or the source for providing carbon may be provided separately.

The heating member 400 heats the crucible 300 to melt or heat materials accommodated in the crucible 300.

The heating member 400 may use a resistance type heating means or an induction heating type heating means. Specifically, the heating member may be formed resistively by heat generation of the heating member 400 itself, or formed by an induction heating method in which the heating member 400 is formed by an induction coil, and a low-frequency current flows the induction coil, thereby heating the crucible 300. However, any heating member may be used, without limitation to the above-described method.

The manufacturing apparatus of silicon carbide according to an exemplary embodiment may further include a rotating member 500. The rotating member 500 is connected to the lower side surface of the crucible 300 to rotate the crucible 300. Since it is possible to provide a molten solution having a uniform composition by the rotation of the crucible 300, a high-quality silicon carbide single crystal may be grown from the silicon carbide seed crystal 210.

Hereinafter, a method for manufacturing a silicon carbide single crystal using the silicon-based molten composition and the manufacturing apparatus of a silicon carbide single crystal as described above is described.

First, initial molten raw materials including the silicon-based molten composition as described above is added to the crucible 300 formed of a carbon material. The raw materials may be in the form of a pellet, metal pieces or powder, but not limited thereto.

The crucible 300 including the initial molten raw material is heated by the heating member 400 under an inert atmosphere such as argon gas. With heating, the initial molten raw material in the crucible 300 is changed to a molten solution including carbon (C), silicon (Si) and metals (a first metal, a second metal and a third metal).

After the crucible 300 reaches a predetermined temperature, the temperature of the molten solution inside the crucible 300 is slowly lowered, and the solubility of carbon in the molten solution is lowered. Thus, when silicon carbide is in the supersaturated state near the seed crystal 210, a silicon carbide single crystal is grown on the seed crystal 210, using the supersaturation as driving force As the silicon carbide single crystal grow, a condition for precipitating silicon carbide from the molten solution may be changed. Here, as time passed, silicon and carbon may be added according to the composition of the molten solution, thereby maintaining the composition of the molten solution within a constant range. The silicon and carbon to be added may be continuously or discontinuously added.

Since the silicon-based molten composition according to an exemplary embodiment has a low melting point, the heating process as described above may be carried out at a low temperature. Accordingly, the stability of the manufacturing process is improved, and the quality of the silicon carbide single crystal may be excellent.

Figure 2:
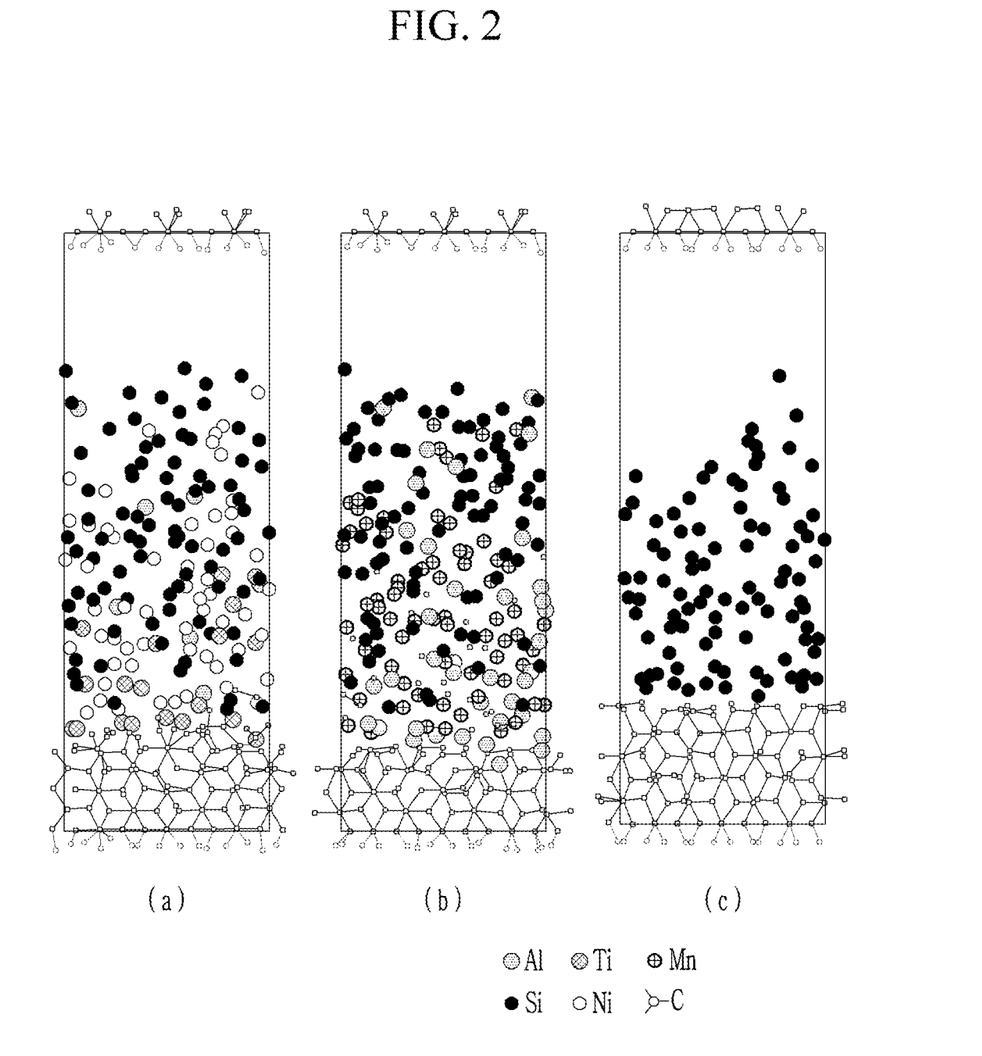
FIG. 2 is morphology according to (a) Example 1, (b) Example 2, and (c) the Comparative Example.

Hereinafter, Examples and Comparative Examples will be described, referring to FIGS. 2 to 6. FIG. 2 is morphology according to Examples 1 and 2, and the Comparative Example; FIG. 3 is a graph for a mean square displacement according to Examples 1 and 2, and the Comparative Example; FIG. 4 is images of precipitated silicon carbide according to Examples 1 and 2; FIG. 5 is an image of precipitated silicon carbide according to the Comparative Example; and FIG. 6 is an XRD analysis graph according to the Examples and the Comparative Example.

FIG. 2 is a result after simulating diffusion of carbon by a calculation method of ab initio molecular dynamics (AIMD). In order to model a phenomenon in which carbon present on a surface of graphite is dissolved when silicon and metals are melted in the graphite crucible, a model composed of a graphite layer, a silicon layer and a metal layer was used.

In FIG. 2, (a) for Example 1 illustrates an atomic structure after 5 ps have elapsed under an NVT ensemble condition in which the number of atoms, volume of the system, and the temperature are constant, since 60 nickel atoms, 20 titanium atoms, 6 aluminum atoms and 96 silicon atoms were added onto the surface of graphite 110 and melted at high temperature.

In FIG. 2, (b) for Example 2 illustrates an atomic structure after 5 ps have elapsed under an NVT ensemble condition in which the number of atoms, volume of the system, and the temperature are constant, since 72 manganese atoms, 32 titanium atoms, 6 aluminum atoms and 96 silicon atoms were added onto the surface graphite 110 and melted at high temperature.

In FIG. 2, (c) for the Comparative Example illustrates an atomic structure after adding only 96 silicon atoms onto the surface of graphite 110 without a metal additive and performing simulation under the same condition as the Examples.

The AIMD calculation used a VASP code, and an exchange-correlation function which is an interaction between electrons used a GGA (generalized gradient approximation) method. The kinetic energy cutoff of electrons was performed under the condition of 300 eV, and only a gamma-only point was used as a k-point. In particular, among carbon atoms used in the modeling, the carbon atom positioned at the bottom has a dangling bond, and thus, was terminated by a hydrogen atom and immobilized during the calculation time, thereby minimizing calculation errors which may occur due to the periodic boundary condition.

As a result of analyzing the Examples and the Comparative Examples as such, it was found that in the case of Examples 1 and 2, the carbon bond positioned on the surface of graphite was broken so that carbon was diffused into the silicon-based molten solution, as shown in (a) to (c) in FIG. 2. However, it was found that in the case of the Comparative Example including only silicon, the carbon bond on the surface of graphite remained intact.

In summary, it was confirmed that when metal elements (the first metal, the second metal and the third metal) are further included as in the Examples, the bond between carbons present inside graphite is broken, and carbons having a broken bond may be dissolved and diffused into the molten solution. Accordingly, in the Example, the solubility of carbon in the silicon-based molten composition may be improved.

Figure 3A:
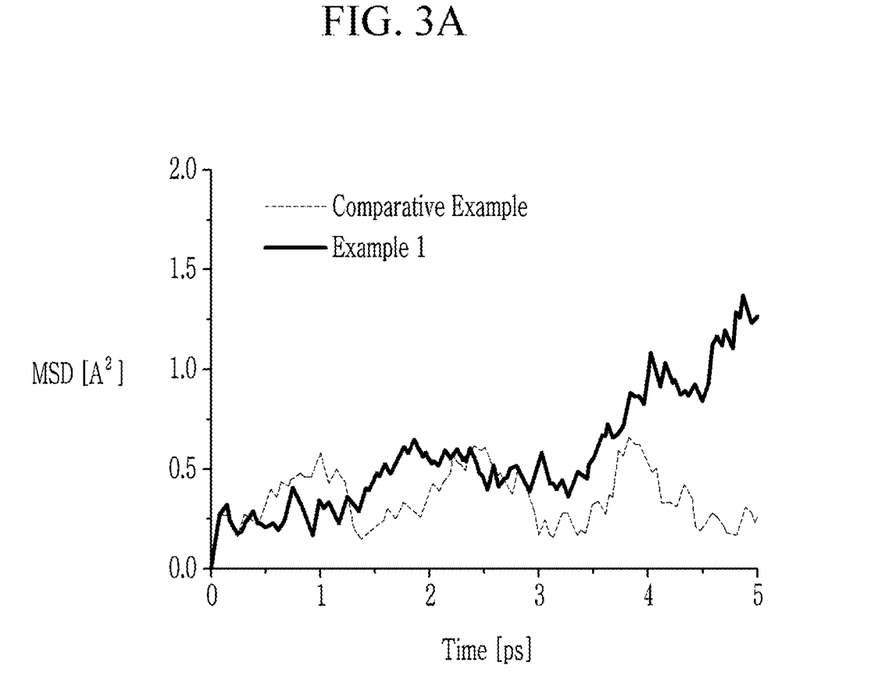
FIG. 3A is a graph for a mean square displacement according to Example 1 and the Comparative Example.

Hereinafter, the mean square displacement of carbon atoms derived from FIG. 3A and FIG. 3B will be described. In Example 1 including nickel (Ni) as the first metal M1, titanium (Ti) as the second metal M2, and aluminum (Al) as the third metal M3, it was found that the mean square displacement of carbon (C) was increased as time passed, as shown in FIG. 3A.

Figure 3B:
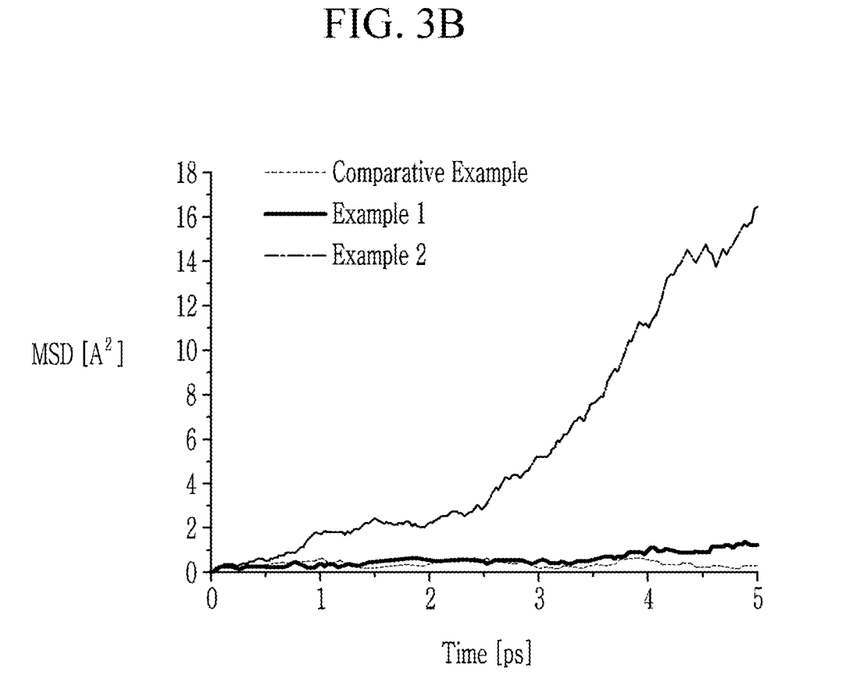
FIG. 3B is a graph for a mean square displacement according to Example 1 and the Comparative Example

In addition, in Example 2 including manganese (Mn) as the first metal M1, titanium (Ti) as the second metal M2, and aluminum (Al) as the third metal M3, it was found that the mean square displacement of carbon varied significantly as time passed, as shown in FIG. 3B.

However, in the case of using the silicon-based molten composition not including a metal other than silicon (Si) as in the Comparative Example, it was shown that the mean square displacement of carbon (C) varied only between about 0 to 0.5, despite the elapsed time.

Upon review of the self-diffusion coefficients of the carbon (C) atom derived using FIG. 3, it was confirmed that Example 1 had a self-diffusion coefficient of about $1.51 \times 10^{-5}$ cm$^2$/s, Example 2 had a self-diffusion coefficient of about $1.97 \times 10^{-4}$ cm$^2$/s, and the Comparative Example had a self-diffusion coefficient converging to near zero. The self-diffusion coefficient is a criterion indicating a diffusion degree of carbon atoms to the silicon-based molten composition. That is, it was confirmed that the solubility of carbon in the silicon-based molten composition was improved in Examples 1 and 2, as compared with the Comparative Example.

Figure 4A:
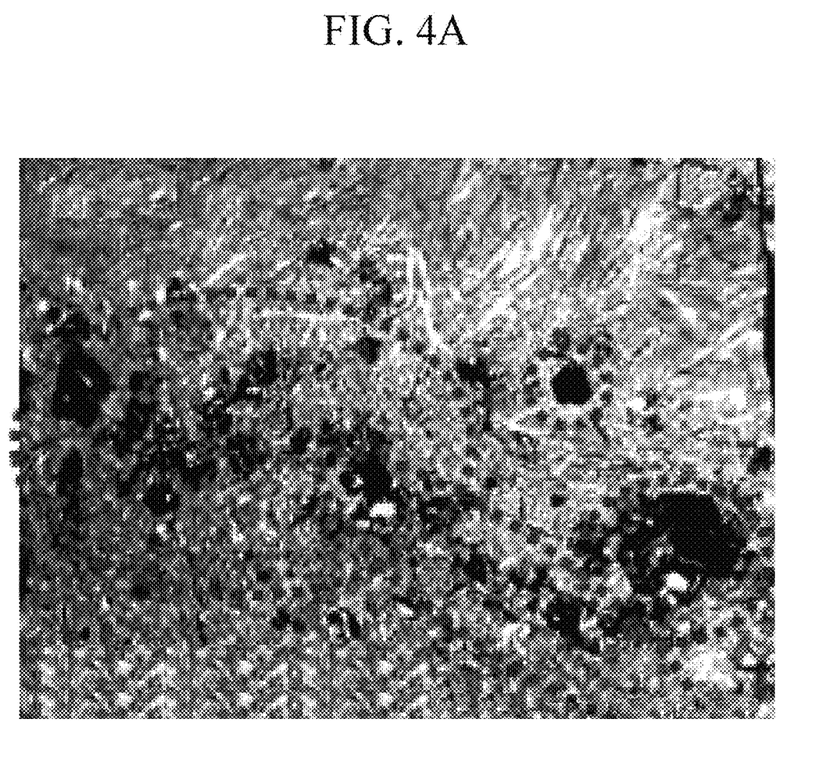
FIG. 4A is an image of precipitated silicon carbide according to Example 1 and 2.
Figure 4B:
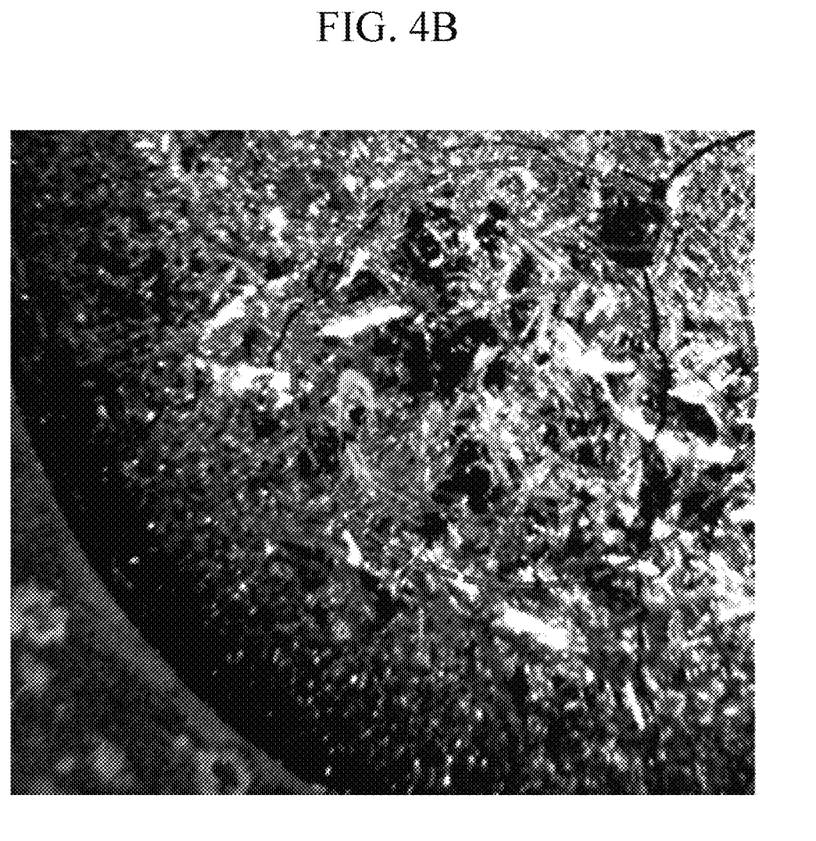
FIG. 4B is an image of precipitated silicon carbide according to Example 2.
Figure 5:
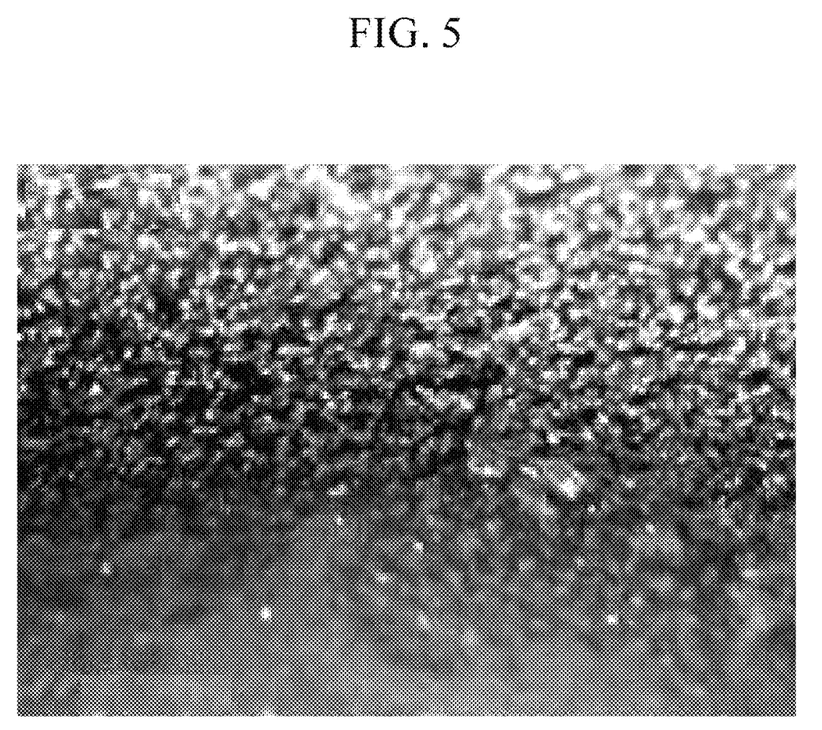
FIG. 5 is an image of precipitated silicon carbide according to the Comparative Example.
Figure 6:
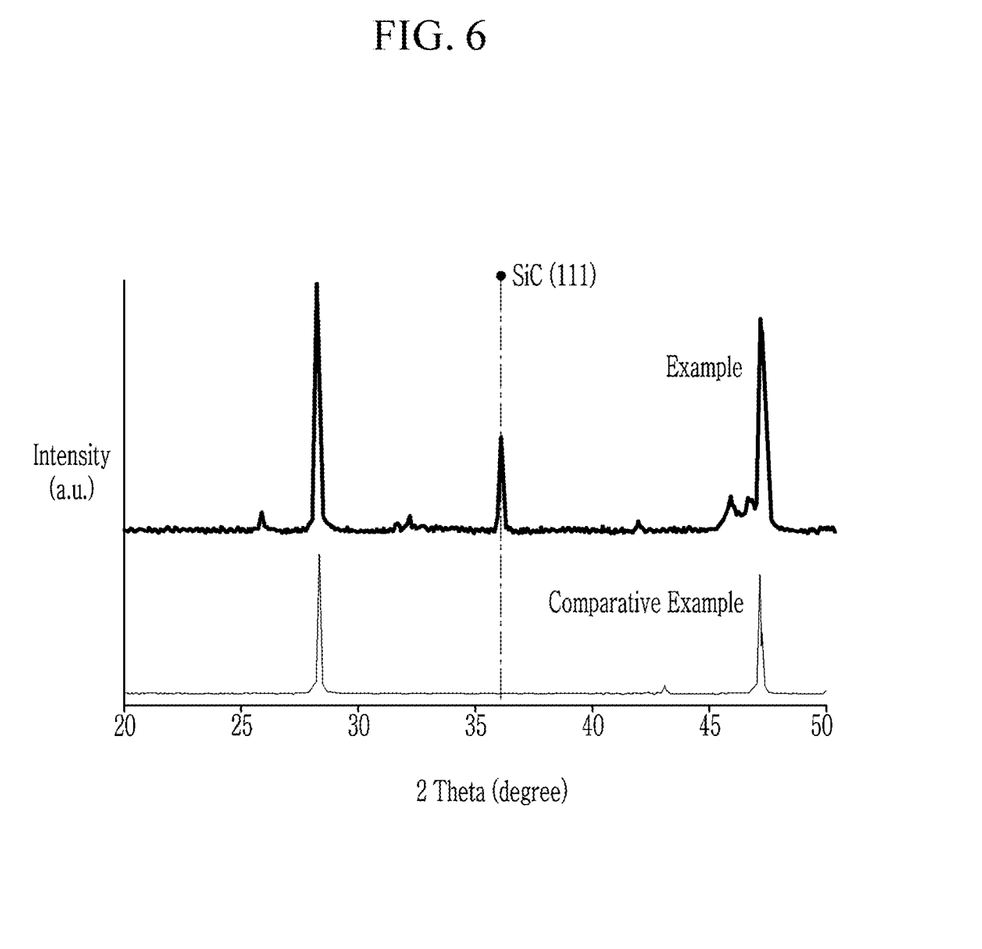
FIG. 6 is an XRD analysis graph according to the Example and the Comparative Example.

Hereinafter, referring to FIGS. 4 and 5, Example 1 for FIG. 4A is a silicon-based molten composition including $Si_{0.56}Ni_{0.3}Ti_{0.1}Al_{0.04}$, Example 2 for FIG. 4B is a silicon composition including $Si_{0.56}Mn_{0.27}Ti_{0.13}Al_{0.04}$, and Comparative Example 1 for FIG. 5 is a molten composition including Si. Each of the molten compositions was charged into a crucible formed of a graphite material, degassing was performed at 400 degrees (° C.), and then the crucible was heated, thereby forming a molten solution.

The heating process includes a step of heating to 1800 degrees (° C.) for 1.5 hours under an argon gas atmosphere, and then a step of maintaining to 1600 degrees (° C.) for 9 hours.

Thereafter, the thus-formed molten solution was cooled for 2 hours. Each of the cooled molten solutions is as shown in FIG. 4A, FIG. 4B, and FIG. 5.

Referring to FIG. 4A and FIG. 4B, it was confirmed that since the silicon-based molten composition including any one of nickel (Ni) and manganese (Mn), titanium (Ti), and aluminum (Al) according to the Examples has the excellent solubility of carbon in the silicon-based molten composition, a large amount of silicon carbide was precipitated.

However, referring to FIG. 5, it was confirmed that since the silicon molten composition according to Comparative Example 1 does not an additional metal, and has the low solubility of carbon in the silicon-based molten composition, silicon carbide was hardly precipitated.

The above description is as shown in the following Table 1, and Examples 1 and 2, and Comparative Examples 1 and 2 as described above were further analyzed. Comparative Example 2 relates to a silicon-based molten composition including silicon, nickel and aluminum, but not including the second metal, as compared with the Examples.

In order to examine the solubility of carbon in the silicon-based molten composition according to Examples 1 and 2, and Comparative Examples 1 and 2, the content of carbon was analyzed three times.

In Example 1, the content of carbon was detected as 0.6791 at %, 0.6541 at %, and 0.6182 at %, respectively, and the average was detected as about 0.6481 at %. In Example 2, the content of carbon was detected as 8.15 at %, 8.57 at %, and 8.43 at %, respectively, and the average was detected as about 8.38 at %.

However, as a result of reviewing the solubility of carbon in the silicon-based molten composition for Comparative Example 1 three times, carbon was detected as less than $10^{-4}$ at %, which means that silicon carbide was hardly detected. The solubility of carbon in the silicon-based molten composition according to Comparative Example 2 was an average of 0.1170 at %, which was improved as compared with Comparative Example 1, but is lower than the carbon solubility of the Examples. When the silicon-based molten composition includes metal elements, the solubility of carbon therein may be improved, as compared with the silicon-based molten composition including only silicon, however, it was found that in particular as in Examples 1 and 2, the solubility of carbon is highest when the composition includes the first metal, the second metal and the third metal.

TABLE 1

|  | Primary (at %) | Secondary (at %) | Tertiary (at %) | Average (at %) |
|---|---|---|---|---|
| Example 1 | 0.6791 | 0.6541 | 0.6182 | 0.6481 |
| Example 2 | 8.15 | 8.57 | 8.43 | 8.383 |
| Comparative Example 1 | $<10^{-4}$ | $<10^{-4}$ | $<10^{-4}$ | $<10^{-4}$ |
| Comparative Example 2 | 0.1076 | 0.1026 | 0.1407 | 0.1170 |

FIG. 6 is an XRD analysis graph for the Examples and the Comparative Examples. In the region corresponding to a silicon carbide (SiC) peak, a peak having a predetermined intensity was detected from the Examples, but the peak was not detected from the Comparative Examples.

In summary, the silicon-based molten composition according to the Examples further includes metals (the first metal, the second metal and the third metal) together with silicon, and it was confirmed that by these metals, the silicon-based molten composition has the improved solubility of carbon, thereby increasing the precipitation amount of silicon carbide. In addition, since the metals according to the Examples have a low melting point, the process temperature for precipitating silicon carbide may be low, thereby precipitating silicon carbide in a more stable state. The quality of the silicon carbide single crystal may be improved.

Hereinbefore, the certain exemplary embodiments of the present invention have been described and illustrated, however, it is apparent to a person with ordinary skill in the art that the present invention is not limited to the exemplary embodiment as described, and may be variously modified and transformed without departing from the spirit and scope of the present invention. Accordingly, the modified or transformed exemplary embodiments as such may not be understood separately from the technical ideas and aspects of the present invention, and the modified exemplary embodiments are within the scope of the claims of the present invention.

DESCRIPTION OF SYMBOLS

100: chamber
210: seed crystal
300: crucible
400: heating member
500: rotating member

The invention claimed is:

1. A silicon-based molten composition used for a solution growth method for forming a silicon carbide single crystal by using a silicon carbide seed crystal, consisting of:
   silicon (Si), a first metal M1, a second metal M2 and a third metal M3, as represented by the following Formula 1,
   wherein the first metal M1 is nickel (Ni), the second metal M2 is one or more selected from the group consisting of scandium (Sc) and titanium (Ti), and the third metal M3 is one or more selected from the group consisting of aluminum (Al) and gallium (Ga):

$$Si_aM1_bM2_cM3_d \qquad \text{Formula 1}$$

wherein $0.3 \le a \le 0.8$, $0.1 \le b \le 0.5$, $0.01 < c \le 0.3$, $0.01 \le d \le 0.2$, and a+b+c+d is 1,
   wherein a content of the first metal M1 is higher than a content of the second metal M2, and the content of the second metal M2 is higher than a content of the third metal M3.

2. The silicon-based molten composition of claim 1, wherein:
   a is 0.4 to 0.7, b is 0.2 to 0.4, c is 0.05 to 0.2, and d is 0.01 to 0.1.

3. The silicon-based molten composition of claim 1, wherein:
   the second metal M2 has a melting point of 1800 degrees (° C.) or less.

4. The silicon-based molten composition of claim 3, wherein:
   the second metal M2 has a melting point of 1700 degrees (° C.) or less.

5. The silicon-based molten composition of claim 1, wherein:
   the third metal M3 has a melting point of 800 degrees (° C.) or less.

6. The silicon-based molten composition of claim 5, wherein:
   the third metal M3 has a melting point of 700 degrees (° C.) or less.

7. The silicon-based molten composition of claim 1, wherein:
   the second metal M2 is titanium (Ti), and the third metal M3 is aluminum (Al).

\* \* \* \* \*